United States Patent
Hu et al.

(10) Patent No.: US 8,018,289 B1
(45) Date of Patent: Sep. 13, 2011

(54) HOLDOVER CIRCUIT FOR PHASE-LOCK LOOP

(75) Inventors: Pengfei Hu, Shanghai (CN); Song Gao, Shanghai (CN)

(73) Assignee: Integrated Device Technology, Inc., San Jose, CA (US)

( * ) Notice: Subject to any disclaimer, the term of this patent is extended or adjusted under 35 U.S.C. 154(b) by 121 days.

(21) Appl. No.: 12/544,201

(22) Filed: Aug. 19, 2009

(51) Int. Cl.
*H03L 7/00* (2006.01)

(52) U.S. Cl. .......................... 331/10; 331/17; 327/20

(58) Field of Classification Search .................... 331/10, 331/17; 327/20
See application file for complete search history.

(56) References Cited

U.S. PATENT DOCUMENTS

| | | | | |
|---|---|---|---|---|
| 5,477,194 | A * | 12/1995 | Nagakura | 331/10 |
| 5,656,975 | A * | 8/1997 | Imura | 331/11 |
| 6,643,347 | B2 * | 11/2003 | Ohishi | 375/376 |
| 7,173,495 | B1 * | 2/2007 | Kenny et al. | 331/49 |
| 7,332,940 | B2 * | 2/2008 | Watanabe | 327/94 |
| 7,714,625 | B2 * | 5/2010 | Chatterjee et al. | 327/156 |
| 2003/0062957 | A1 * | 4/2003 | Terashima et al. | 331/17 |
| 2007/0013449 | A1 * | 1/2007 | Ishii et al. | 331/16 |

OTHER PUBLICATIONS

"14-Output Clock Generator with Integrated 1.6 GHz VCO, AD9516-4," Analog Devices, Inc., Norwood, Massachusetts, Rev. 0, 2007.

* cited by examiner

*Primary Examiner* — Joseph Chang
*Assistant Examiner* — Jeffrey Shin
(74) *Attorney, Agent, or Firm* — Kenneth Glass; Stanley J. Pawlik; Glass & Associates

(57) ABSTRACT

A clock circuit includes a phase-lock loop and a holdover circuit. The phase-lock loop generates an output clock signal having a constant frequency based on a loop filter voltage of a loop filter in the phase-lock loop. The holdover circuit generates and stores a digital value indicating the loop filter voltage and generates an analog voltage signal having the loop filter voltage indicated by the digital value. Further, the holdover circuit maintains the output clock signal at the constant frequency during a holdover of the phase-lock loop by regenerating the loop filter voltage based on the analog voltage signal. Because the analog voltage signal is based on the digital value, the voltage of the loop filter does not decay over time during the holdover of the phase-lock loop. As a result, the output clock signal remains at the constant frequency during the holdover of the phase-lock loop.

20 Claims, 5 Drawing Sheets

HOLDOVER CIRCUIT FOR PHASE-LOCK LOOP

BACKGROUND

Phase-lock loops are widely used in integrated circuit devices for communication applications. In such integrated circuits, a phase-lock loop generates an output clock signal based on a reference clock signal and generates a feedback clock signal based on the output clock signal. Further, the phase-lock loop locks a phase of the feedback clock signal with a phase of the reference clock signal. When the phase of the feedback clock signal is locked with the phase of the reference clock signal, the phase-lock loop is considered to be locked. Moreover, the frequency of the output clock signal is constant when the phase-lock loop is locked.

Some communication applications require the phase-lock loop to maintain the frequency of the output clock signal constant if the reference clock signal becomes unavailable when the phase-lock loop is locked. Maintaining the frequency of the output clock signal constant when the reference clock becomes unavailable is often referred to as a holdover of the phase-lock loop. One technique for performing a holdover of a phase-lock loop involves setting an output of a charge-pump of the phase-lock loop into a high-impedance state so that a capacitor in a loop filter of the phase-lock loop maintains a constant loop filter voltage. In this technique, a voltage-controlled oscillator of the phase-lock loop temporarily maintains the frequency of the output clock signal constant when the output of the charge pump is in the high-impedance state. Because the capacitor in the loop filter has a leakage current, however, the loop filter voltage eventually decays causing the frequency of the output clock signal to drift away from the constant frequency.

In light of the above, a need exists for an improved system and method for performing a holdover of a phase-lock loop. A further need exists for maintaining the frequency of an output clock signal of a phase-lock loop constant during a holdover of the phase-lock loop.

SUMMARY

In various embodiments, a clock circuit includes a phase-lock loop and a holdover circuit. The phase-lock loop includes a loop filter and a voltage-controlled oscillator. The loop filter generates a loop filter voltage and also generates a loop filter signal based on the loop filter voltage. The voltage-controlled oscillator generates an output clock signal based on the loop filter signal. Further, the phase-lock loop maintains a frequency of the output clock signal at a constant frequency when the phase-lock loop is in a locked state.

The holdover circuit generates and stores a digital value indicating the voltage in the loop filter and generates an analog voltage signal having the loop filter voltage indicated by the digital value. Moreover, the holdover circuit maintains the output clock signal at the constant frequency during a holdover of the phase-lock loop by regenerating the loop filter voltage based on the analog voltage signal. Because the analog voltage signal is based on the digital value, the voltage of the loop filter does not decay over time during the holdover of the phase-lock loop. As a result, the output clock signal remains at the constant frequency during the holdover of the phase-lock loop.

A holdover circuit, in accordance with one embodiment, includes an analog-to-digital converter, a digital storage unit, and a digital-to-analog converter. The digital storage unit is coupled to the analog-to-digital converter and the digital-to-analog converter. The analog-to-digital converter generates a digital value indicating a loop filter voltage in a loop filter of a phase-lock loop. The digital storage unit stores the digital value. The digital-to-analog converter generates an analog voltage signal having the loop filter voltage indicated by the digital value for regenerating the loop filter voltage in the loop filter.

A clock circuit, in accordance with one embodiment, includes a phase-lock loop and a holdover circuit coupled to the phase-lock loop. The phase-lock loop includes a phase detector, a charge pump, a loop filter, and a voltage-controlled oscillator. The charge pump is coupled to the frequency detector and the loop filter. Additionally, the voltage-controlled oscillator is coupled to the loop filter and the phase detector. The phase detector is configured to generate a phase error signal indicating a phase difference between a reference clock signal and an output clock signal. The charge pump is configured to generate a charge pump signal based on the phase error signal. The charge pump signal indicates the phase difference between the reference clock signal and the output clock signal. The loop filter is configured to generate a loop filter voltage based on the charge pump signal. Additionally, the loop filter is configured to generate a loop filter signal based on the loop filter voltage. The voltage-controlled oscillator is configured to generate the output clock signal based on the loop filter signal. The holdover circuit is configured to generate a digital value indicating the loop filter voltage and store the digital value. The holdover circuit is also configured to generate an analog voltage signal having the loop filter voltage indicated by the digital value for regenerating the loop filter voltage in the loop filter.

A method of performing a holdover of a phase-lock loop, in accordance with one embodiment, includes generating a digital value indicating a loop filter voltage in a loop filter of a phase-lock loop. The method further includes storing the digital value. Additionally, the method includes generating an analog voltage signal having the loop filter voltage indicated by the digital value for regenerating the loop filter voltage in the loop filter.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention.

DETAILED DESCRIPTION

In various embodiments, a clock circuit includes a phase-lock loop and a holdover circuit. The phase-lock loop generates an output clock signal having a constant frequency based on a loop filter voltage of a loop filter in the phase-lock loop. The holdover circuit generates and stores a digital value indicating the loop filter voltage and generates an analog voltage signal having the loop filter voltage indicated by the digital value. Further, the holdover circuit maintains the output clock signal at the constant frequency during a holdover of the phase-lock loop by regenerating the loop filter voltage based on the analog voltage signal. Because the analog voltage signal is based on the digital value, the voltage of the loop filter does not decay over time during the holdover of the phase-lock loop. As a result, the output clock signal remains at the constant frequency during the holdover of the phase-lock loop.

Figure 1:
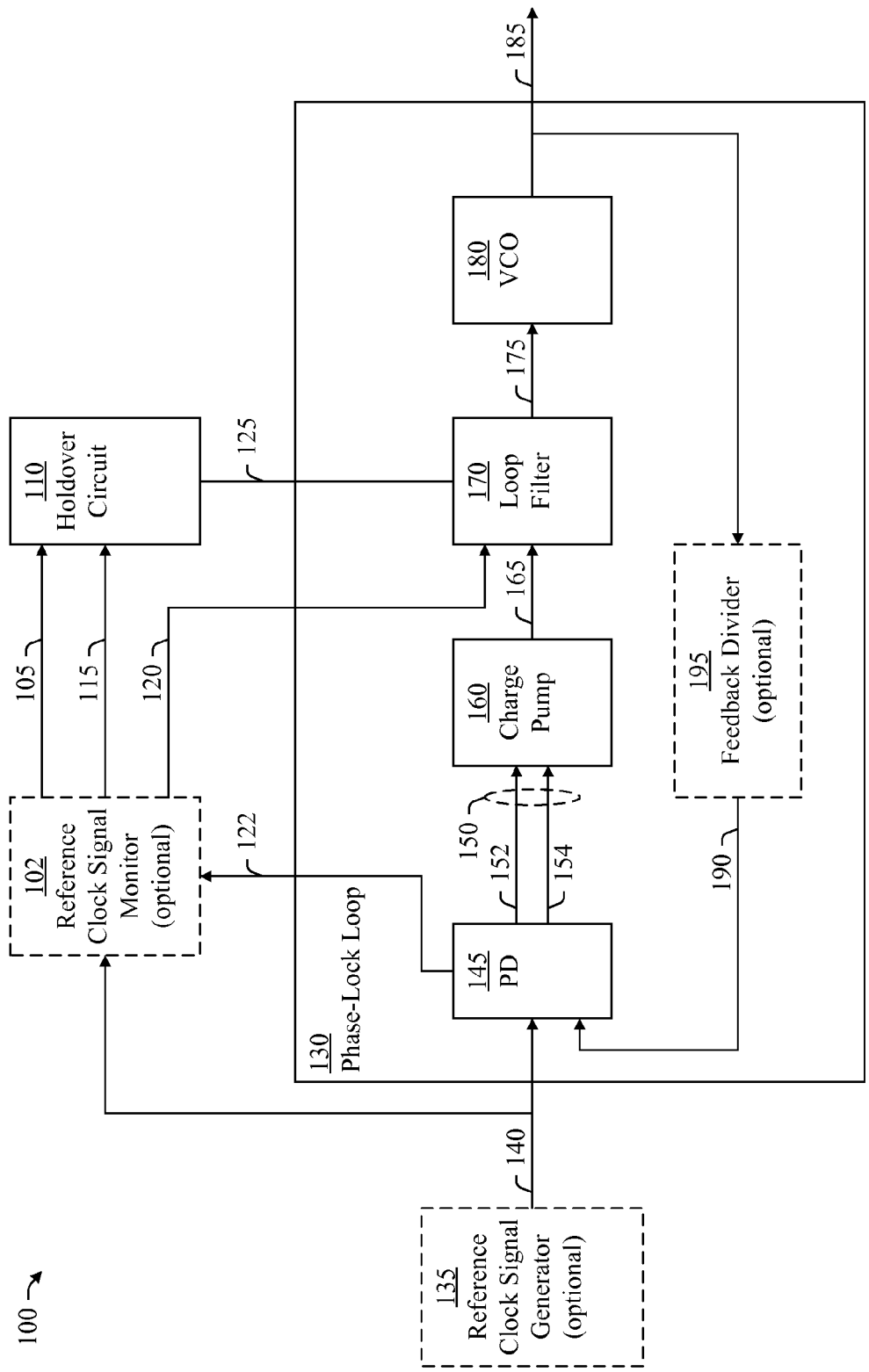
FIG. 1 is a block diagram of a clock circuit, in accordance with an embodiment of the present invention.

FIG. 1 illustrates a clock circuit 100, in accordance with an embodiment of the present invention. The clock circuit 100 includes a phase-lock loop 130 and a holdover circuit 110 coupled (e.g., connected) to the phase-lock loop 130. The clock circuit 100 also includes an optional reference clock signal generator 135 and an optional reference clock signal monitor 102. The reference clock signal generator 135 is coupled to the reference clock signal monitor 102 and the phase-lock loop 130. Additionally, the reference clock signal monitor 102 is coupled to the holdover circuit 110 and the phase-lock loop 130.

In various embodiments, the phase-lock loop 130 generates an output clock signal 185 based on a reference clock signal 140. Additionally, the phase-lock loop 130 enters into a locked state by locking a phase of the output clock signal 185 with a phase of the reference clock signal 140. In the locked state, the phase-lock loop 130 generates the output clock signal 185 having a constant frequency. The phase-lock loop 130 also generates a loop filter voltage 125 and maintains the loop filter voltage 125 constant in the locked state.

The holdover circuit 110 generates a digital value indicating the loop filter voltage 125 and stores the digital value based on a holdover control signal 105. In some embodiments, the holdover circuit 110 stores the digital value indicating the loop filter voltage 125 in response to the holdover control signal 105. In other embodiments, the holdover circuit 110 generates and stores the digital value indicating the loop filter voltage 125 on a continual basis (e.g., a periodic basis). In this way, the holdover circuit 110 updates the digital value stored in the holdover circuit 110 on a continual basis. Moreover, the holdover circuit 110 stops updating the digital value stored in the holdover circuit 110 in response to the holdover control signal 105.

In various embodiments, the phase-lock loop 130 transitions from the locked state to a holdover state based on the holdover selection signal 115 and the holdover selection signal 120. In the transition from the locked state to the holdover state, the phase-lock loop 130 stops generating the loop filter voltage 125 in response on the holdover selection signal 115, and instead regenerates the loop filter voltage 125 in response to the holdover selection signal 120 based on the digital value stored in the holdover circuit 110. In this way, the holdover circuit 110 maintains the loop filter voltage 125 constant and continues to lock the phase of the output clock signal 185 to the phase of the reference clock signal 140 during the transition of the phase-lock loop 130 from the locked state to the holdover state and throughout the holdover state. As a result, the phase-lock loop 130 maintains the frequency of the output clock signal 185 constant during the transition of the phase-lock loop 130 from the locked state to the holdover state and throughout the holdover state. Moreover, because the phase-lock loop 130 regenerates the loop filter voltage 125 based on the digital value stored in the holdover circuit 110, the loop filter voltage 125 does not decay during the holdover state. As a result, the frequency of the output clock signal 185 remains constant and does not drift during the holdover state. In some embodiments, the holdover selection signal 115 and the holdover selection signal 120 are the same selection signal.

The phase-lock loop 130 transitions from the holdover state back to the locked state based on the holdover selection signal 115 and the holdover selection signal 120. In the transition from the holdover state to the locked state, the holdover circuit 110 stops regenerating the loop filter voltage 125 in response to the holdover selection signal 115, and the loop filter 170 generates the loop filter voltage 125 in response to the holdover selection signal 120. In this way, the holdover circuit 110 maintains the loop filter voltage 125 constant during the transition of the phase-lock loop 130 from the holdover state back to the locked state. As a result, the phase-lock loop 130 maintains the frequency of the output clock signal 185 constant frequency during the transition of the phase-lock loop 130 from the holdover state back to the locked state.

In embodiments including the reference clock signal generator 135, the reference clock signal generator 135 generates the reference clock signal 140. In embodiments without the reference clock signal generator 135, the phase-lock loop 130 receives the reference clock signal 140 from a source external of the clock circuit 100. In embodiments including the reference clock signal monitor 102, the reference clock signal monitor 102 monitors the reference clock signal 140 and generates the holdover control signal 105, the holdover selection signal 115, and the holdover selection signal 120 based on the reference clock signal 140. In various embodiments, the reference clock signal monitor 102 monitors the reference clock signal 140 for one or more quality characteristics and determines whether each quality characteristic meets a specification of the reference clock signal 140 (e.g., a predetermined threshold). For example, the reference clock signal monitor 102 may monitor the reference clock signal 140 to determine whether the reference clock signal 140 is available, whether the frequency of the reference clock signal 140 is accurate, or whether the frequency of the reference clock signal 140 has changed by a percentage (e.g., a predetermined percentage). If the reference clock signal monitor 102 determines the reference clock signal 140 does not meet a specification of the reference clock signal 140, the reference clock signal monitor 102 generates the holdover control signal 105, the holdover selection signal 115, and the holdover selection signal 120 to cause the phase-locked loop 130 to transition into the holdover state.

In some embodiments, the phase-lock loop 130 generates an optional lock signal 122 indicating whether the phase-lock loop 130 is in the locked state. Moreover, the reference clock signal monitor 102 generates the holdover control signal 105, the holdover selection signal 115, and the holdover selection signal 120 based on both the reference clock signal 140 and the lock signal 122. For example, the reference clock signal monitor 102 may cause the phase-lock loop 130 to transition into the holdover state based on the reference clock signal 140 if the reference clock signal monitor 102 determines the phase-lock loop 130 is in the locked state but not if the phase-lock loop 130 is in an unlocked state. In this example, the phase-lock loop 130 is in the unlocked state if the phase of the output clock signal 185 is not locked to the phase of the reference clock signal 140.

The phase-lock loop 130 includes a phase detector (PD) 145, a charge pump 160, a loop filter 170, a voltage-controlled oscillator (VCO) 180, and an optional feedback divider 195. The charge pump 160 is coupled (e.g., connected) the phase detector 145 and the loop filter 170. The voltage-controlled oscillator 180 is coupled (e.g., connected) to the loop filter 170 and the phase detector 145. Additionally, the loop filter 170 is coupled (e.g., connected) to the holdover circuit 110. In embodiments including the reference clock signal generator 135, the phase detector 145 is coupled (e.g., connected) to the reference clock signal generator 135. In embodiments including the reference clock signal monitor 102, the loop filter 170 is coupled (e.g., connected) to the reference clock signal monitor 102. In further embodiments including the reference clock signal monitor 102 in which the phase detector 145 generates the lock signal 122, the phase detector 145 is coupled (e.g., connected) to the reference clock signal monitor 102.

The phase detector 145 generates a phase error signal 150 indicating a phase difference between the reference clock signal 140 and a feedback clock signal 190. Additionally, the charge pump 160 generates a charge pump signal 165 indicating the phase difference between the reference clock signal 140 and a feedback clock signal 190. In some embodiments, the charge pump signal 165 includes a current indicating the phase difference between the reference clock signal 140 and a feedback clock signal 190. In further embodiments, the phase detector 145 is a phase frequency detector (PFD). In these further embodiments, the phase detector 145 generates the phase error signal 150 including a charge up signal 152 and a charge down signal 154. The charge up signal 152 indicates the charge pump 160 is to increase the current in the charge pump signal 165 and the charge down signal 154 indicates the charge pump 160 is to decrease the current in the charge pump signal 165.

The loop filter 170 generates the loop filter voltage 125 based on the charge pump signal 165 when the phase-lock loop 130 is in the locked state or the unlocked state. Moreover, the loop filter 170 filters out higher frequency components of the charge pump signal 165 and passes lower frequency components of the charge pump signal 165. In this way, the loop filter 170 functions as a low-pass filter. Additionally, the loop filter 170 regenerates the loop filter voltage 125 when the phase-lock loop 130 is in the holdover state, as is described more fully herein. The voltage-controlled oscillator 180 generates the output clock signal 185 having a frequency (i.e., a center frequency) based on a voltage of the loop filter signal 175.

In embodiments including the feedback divider 195, the feedback divider 195 generates the feedback clock signal 190 by dividing a frequency of the output clock signal 185. In embodiments without the feedback divider 195, the feedback clock signal 190 is the same as the output clock signal 185.

Figure 2:
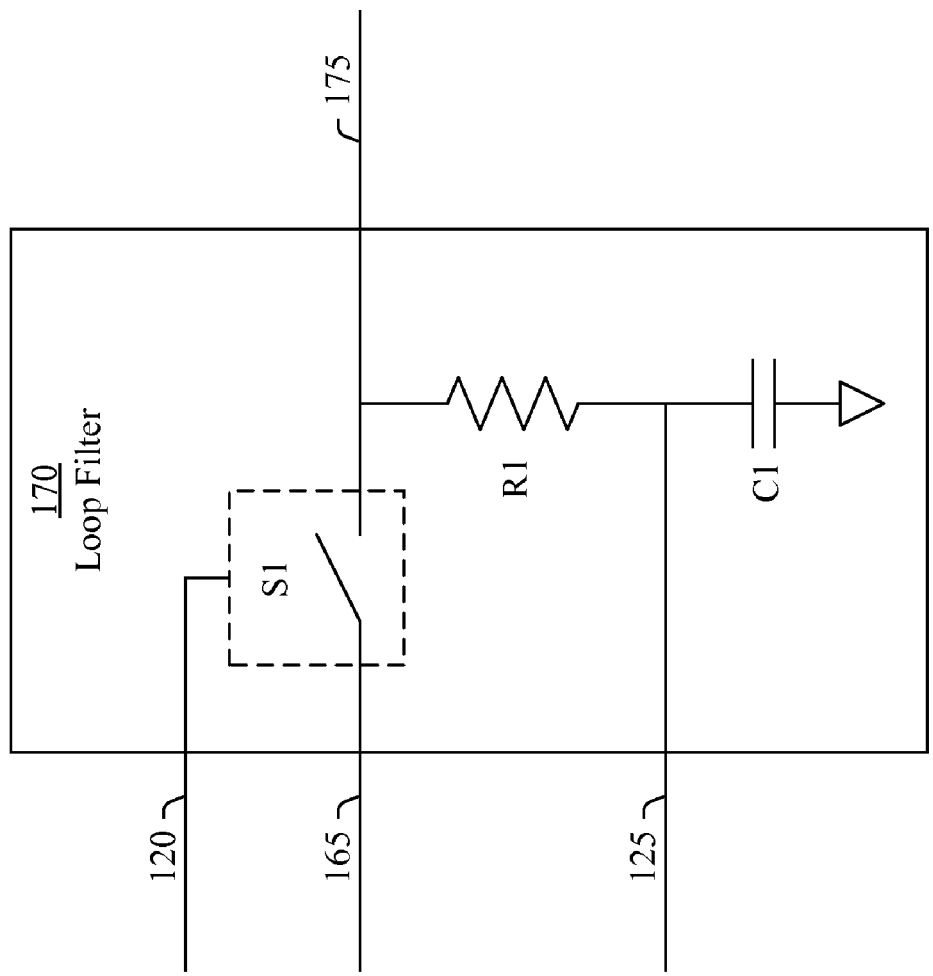
FIG. 2 is a block diagram of a loop filter, in accordance with an embodiment of the present invention.

FIG. 2 illustrates the loop filter 170, in accordance with an embodiment of the present invention. The loop filter 170 includes a switch S1, a resistor R1, and a capacitor C1. One end of the capacitor C1 is connected to a ground potential. The other end of the capacitor C1 is connected to one end of the resistor R1 at a junction between the capacitor C1 and the resistor R1. Moreover, the loop filter 170 generates the loop filter voltage 125 and regenerates the loop filter voltage 125 at the junction between the capacitor C1 and the resistor R1. The other end of the resister R1 is connected to an output of the switch S1.

In operation, an input of switch S1 receives the charge pump signal 165 and a control of the switch S1 receives the holdover selection signal 120. The switch S1 passes the charge pump signal 165 to the output of the switch S1 as the loop filter signal 175 based on the holdover selection signal 120 when the phase-lock loop 130 is in the locked state or the unlocked state. In turn, the loop filter 170 generates the loop filter voltage 125 based on the charge pump signal 165 by charging the capacitor C1 to the loop filter voltage 125. In this process, a current in the charge pump signal 165 flows through the resistor R1 into the capacitor C1 to charge the capacitor C1 to the loop voltage 125. In the locked state, the loop voltage 125 is deemed to be a locked state voltage of the phase-lock loop 130.

When the phase-lock loop 130 is in the holdover state, the switch S1 isolates the charge pump signal 165 from the loop filter signal 175, the resistor R1, and the capacitor C1 based on the holdover selection signal 120. As a result, the charge pump signal 165 stops charging the capacitor C1. Nonetheless, the loop voltage 125 does not decay because the holdover circuit 110 regenerates the loop filter voltage 125 to maintain the loop filter voltage 125 at the locked state voltage of the phase-lock loop 130, as is described more fully herein. In various embodiments, the switch S1 is an electrical switch, such as a transistor, or an electromechanical switch, such as an electromechanical relay.

Figure 3:
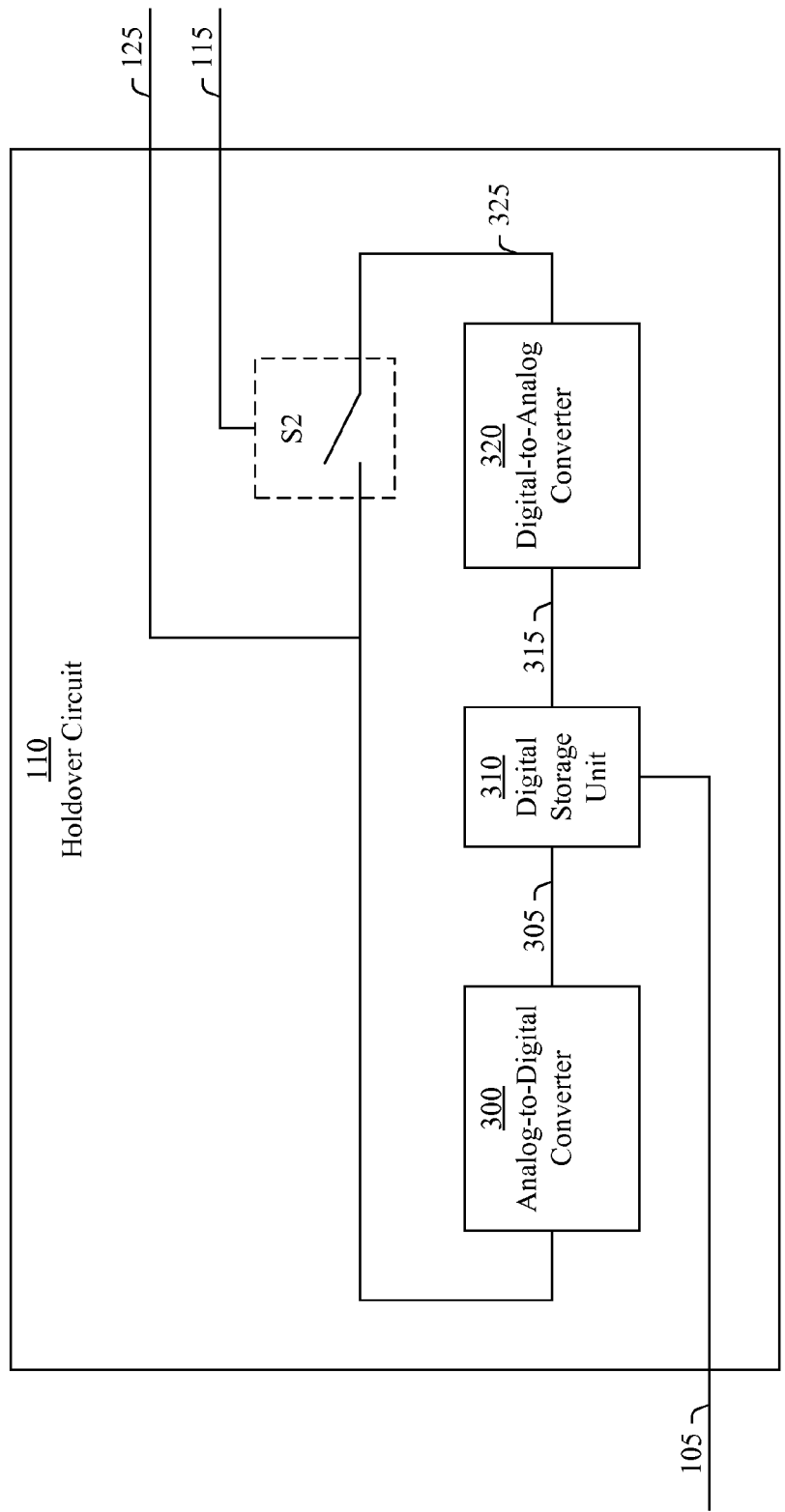
FIG. 3 is a block diagram of a holdover circuit, in accordance with an embodiment of the present invention.

FIG. 3 illustrates the holdover circuit 110, in accordance with an embodiment of the present invention. The holdover circuit 110 includes a switch S2, an analog-to-digital converter 300, a digital storage unit 310, and a digital-to-analog converter 320. The switch S2 is coupled (e.g., connected) to the analog-to-digital converter 300 and the digital-to-analog converter 320. Additionally, the digital storage unit 310 is coupled (e.g., connected) to the analog-to-digital converter 300 and the digital-to-analog converter 320.

The analog-to-digital converter 300 generates a digital input signal 305 based on the loop filter voltage 125. The digital input signal 305 represents a digital value indicating the loop filter voltage 125. In turn, the digital storage unit 310 stores the digital value based on the digital input signal 305. Additionally, the digital storage unit 310 generates a digital output signal 315 based on the holdover control signal 105. The digital output signal 315 represents the digital value stored in the digital storage unit 310. The digital-to-analog converter 320 generates an analog voltage signal 325 based on the digital output signal 315 for regenerating the loop filter voltage 125 in the loop filter 170. Moreover, the analog voltage signal 325 has the loop filter voltage 125 indicated by the digital value represented by the digital output signal 315.

The digital-to-analog converter 320 provides the analog voltage signal 325 to an input of the switch S2. An output of the switch S2 is connected to the analog-to-digital converter 300 and the loop filter 170 of the phase-lock loop 130. Moreover, the output of the switch S2 receives the loop filter voltage 125 generated by the loop filter 170 when the phase-lock loop 130 is in the locked state or the unlocked state. When the phase-lock loop 130 is in the holdover state, the switch S2 receives the holdover selection signal 115 at a control of the switch S2 and passes the analog voltage signal 325 to the output of the switch S2. In this way, the holdover circuit 110 provides the analog voltage signal 325 to the loop filter 170. In turn, the loop filter 170 regenerates the loop filter voltage 125 based on the analog voltage signal 325 by maintaining the charge of the capacitor C1. In this process, a current in the analog voltage signal 325 flows through the capacitor C1 to maintain the loop voltage 125 at the locked state voltage of the phase-lock loop 130. As a result, the loop filter voltage 125 in the loop filter 170 is the same as the loop filter voltage 125 indicated by the digital value stored in the digital storage unit 310.

In various embodiments, the digital storage unit 310 stores the digital value in the digital storage unit 310 based on the digital input signal 305 when the phase-lock loop 130 is in the locked state. As a result, the digital value stored in the digital storage unit 310 represents the locked state voltage of the phase-lock loop 130. In some embodiments, the digital storage unit 310 updates the digital value stored in the digital storage unit 310 continually based on the digital input signal 305. For example, the digital storage unit 310 may continually update the digital value stored in the digital storage unit 310 based on the digital input signal 305 until the phase-lock loop 130 enters into the locked state. In these embodiments, the digital storage unit 310 stops updating the digital value stored in the digital storage unit 310 before the phase-lock loop 130 transitions into the holdover state. In this way, the holdover control signal 105 functions to hold the digital value stored in the digital storage unit 310 when the phase-lock loop 130 is in the holdover state and the digital value stored in the digital storage unit 310 represents the locked state voltage of the phase-lock loop 130.

In some embodiments, the digital storage unit 310 updates the digital value stored in the digital storage unit 310 based on the holdover control signal 105 when the phase-lock loop 130 transition into the holdover state. In this way, the holdover control signal 105 functions to store the digital value representing the locked state of the phase-lock loop 130 into the digital storage unit 310 when the phase-lock loop transitions into the holdover state and to hold the digital value stored in the digital storage unit 310 when the phase-lock loop 130 is in the holdover state.

Figure 4:
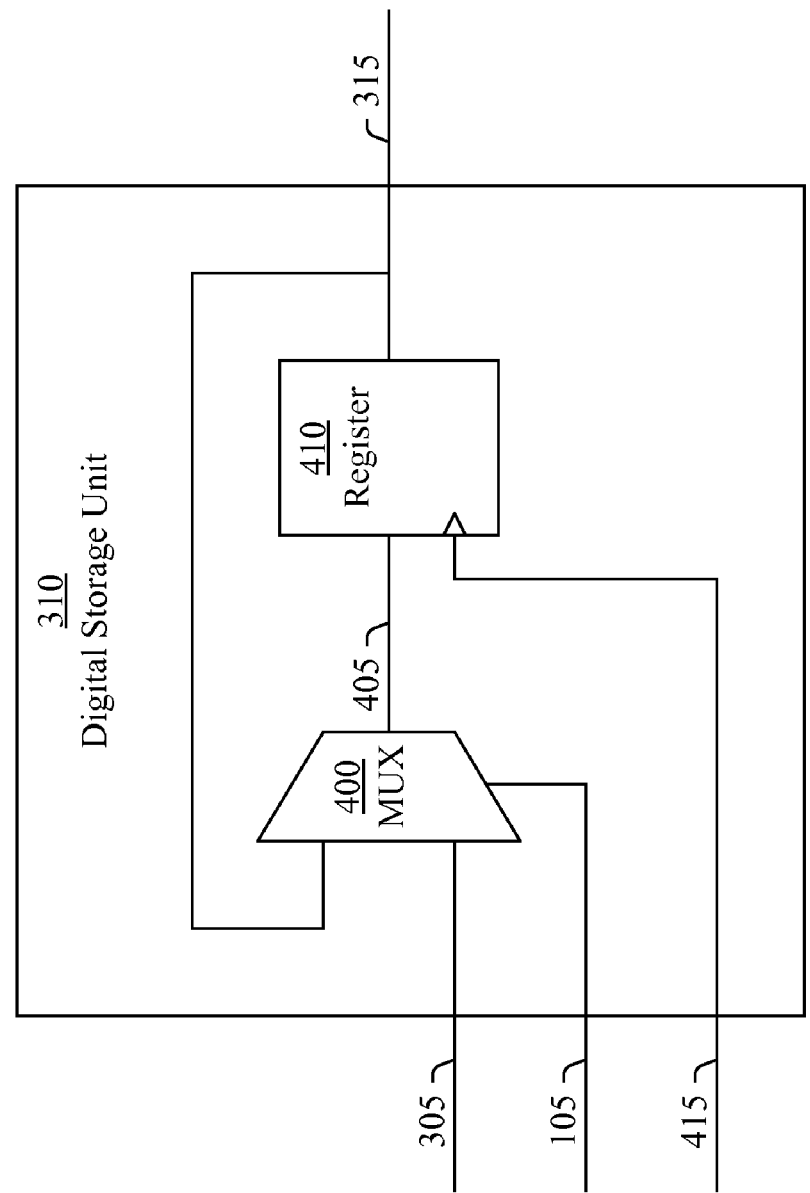
FIG. 4 is a block diagram of a digital storage unit, in accordance with an embodiment of the present invention.

FIG. 4 illustrates the digital storage unit 310, in accordance with an embodiment of the present invention. The digital storage unit 310 includes a selector (MUX) 400 and a register 410 coupled (e.g., connected) to the selector 400. For example, the selector 400 may be a multiplexor and the register 410 may include a number of data flip-flops for storing a digital value. The selector 400 selects either the digital input signal 305 or the digital output signal 315 based on the holdover control signal 105 and passes the selected signal as a selected digital signal 405. The selected digital signal 405 represents the digital value that is represented by the signal (i.e., the digital input signal 305 or the digital output signal 315) selected by the selector 400.

The register 410 stores the digital value represented by the selected digital signal 405 based on a storage clock signal 415. In this way, the digital storage unit 310 is a synchronous storage. Moreover, the digital storage unit 310 updates the digital value stored in the register 410 continually (e.g., periodically) based on the storage clock signal 415 when the selector 400 passes the digital input signal 305 as the selected digital signal 405. When the selector 400 passes the digital output signal 315 as the selected digital signal 405, the register 410 continues to store the digital value represented by the selected digital signal 405 but does not update the digital value because the digital value stored in the register 410 does not change when the selector 400 passes the digital output signal 315 as the selected digital signal 405. In various embodiments, the storage clock signal 415 is the same as the reference clock signal 140, or the output clock signal 185, or the feedback clock signal 190. In other embodiments, the storage clock signal 415 is generated by another clock source in the clock circuit 100 or external of the clock circuit 100.

Figure 5:
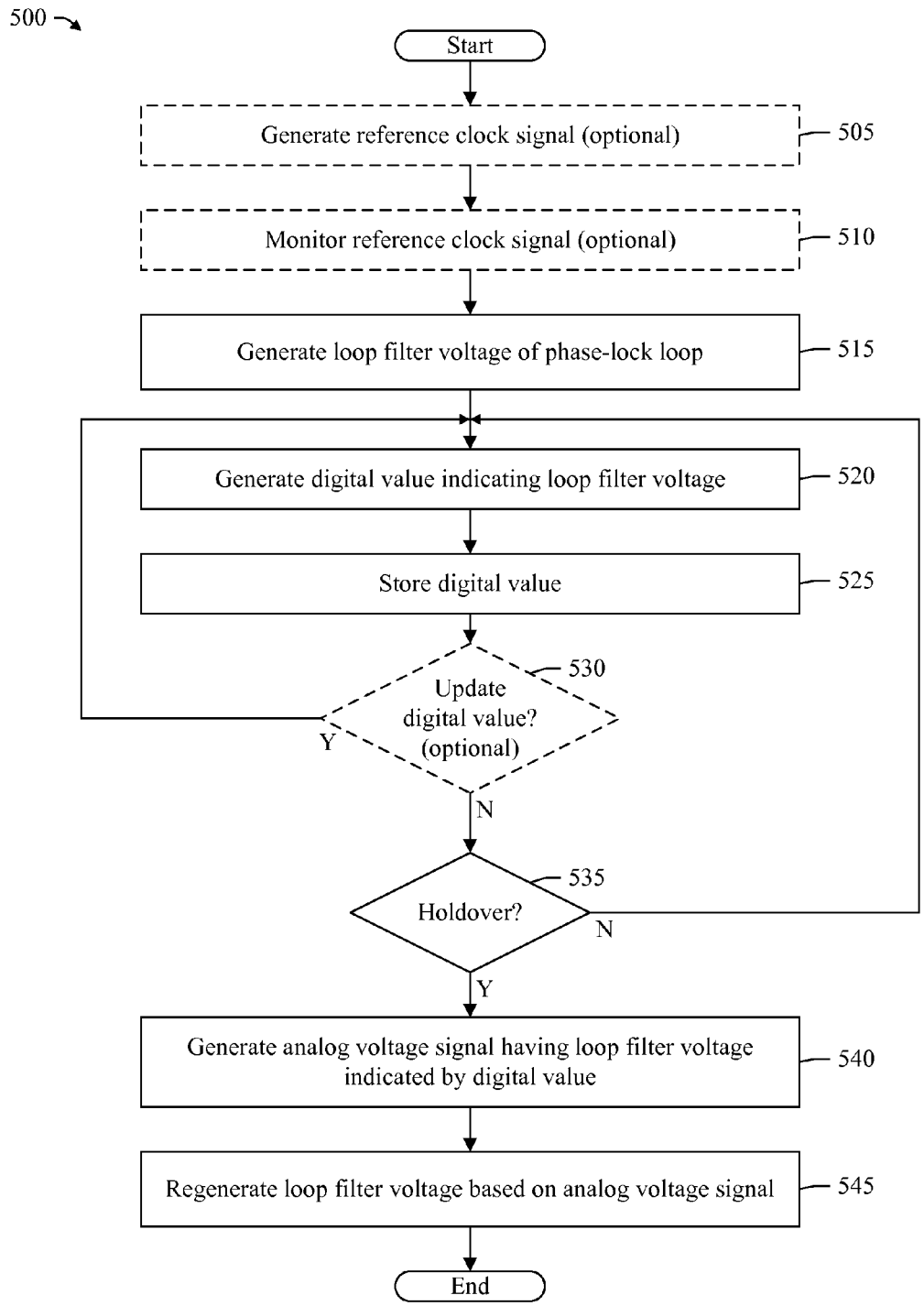
FIG. 5 is a flow chart of a method of performing a holdover of a phase-lock loop, in accordance with an embodiment of the present invention.

FIG. 5 illustrates a method 500 of performing a holdover of a phase-lock loop, in accordance with an embodiment of the present invention. In optional step 505, a reference clock signal is generated. In various embodiments, the reference clock signal generator 135 generates the reference clock signal 140. In embodiments without step 505, the reference clock signal 140 is generated by a source external of the clock circuit 100. The method 500 then proceeds to step 510.

In optional step 510, a reference clock signal is monitored. In various embodiments, the reference clock signal monitor 102 monitors the reference clock signal 140 to determine one or more quality characteristics of the reference clock signal 140 and compares each quality characteristic with a specification of the reference clock signal 140. Additionally, the reference clock signal monitor 102 generates the holdover control signal 105, the holdover selection signal 115, and the holdover selection signal 120 based on the result of the comparison. In embodiments without step 510, the holdover control signal 105, the holdover selection signal 115, and the holdover selection signal 120 are generated by a source external of the clock circuit 100. The method 500 then proceeds to step 515.

In step 515, a loop filter voltage of a phase-lock loop is generated. In various embodiments, the loop filter 170 of the phase-lock loop 130 generates the loop filter voltage 125 based on the charge pump signal 165 and the holdover selection signal 120. In these embodiments, the loop filter 170 closes the switch S1 based on the holdover selection signal 120 and the holdover circuit 110 opens the switch S2 based on the holdover selection signal 115. As a result, a current in the charge pump signal 165 flows through the resistor R1 to the capacitor C1. Moreover, the loop filter 170 generates the loop filter voltage 125 based on the charge pump signal 165 by charging the capacitor C1 to the loop filter voltage 125. The method 500 then proceeds to step 520.

In step 520, a digital value indicating the loop filter voltage is generated. In various embodiments, the holdover circuit 110 generates a digital value indicating the loop filter voltage 125. For example, the analog-to-digital converter 300 of the holdover circuit 110 may generate the digital input signal 305 based on the loop filter voltage 125 so that the digital input signal 305 represents a digital value indicating the loop filter voltage 125. In this way, the analog-to-digital converter 300 converts the loop filter voltage 125 to the digital input signal 305. The method 500 then proceeds to step 525.

In step 525, the digital value is stored. In various embodiments, the holdover circuit 110 stores the digital value when the phase-lock loop 130 is in the locked state. In this way, the digital value stored in the holdover circuit 110 represents the locked state voltage of the phase-lock loop 130. For example, the digital storage unit 310 of the holdover circuit 110 may store the digital value based on the digital input signal 305 when the phase-lock loop 130 is in the locked state.

In embodiments in which the digital storage unit 310 includes the selector 400 and the register 410, the selector 400 passes the digital input signal 305 to the register 410 based on the holdover control signal 105. In turn, the register 410 stores the digital value represented by the digital input signal 305 based on the storage clock signal 415. The method 500 then proceeds to step 530.

In optional step 530, the digital value is updated. In various embodiments, the holdover circuit 110 updates the digital value stored in the holdover circuit 110 continually based on the holdover control signal 115 and the storage clock signal 415. For example, the holdover circuit 110 may update the digital value stored in the holdover circuit 110 by periodically storing a digital value into the digital storage unit 310 based on the storage clock signal 415 when the holdover control signal 115 enables the digital storage unit 310 to store the digital value. In this example, the holdover control signal 115 enables the digital storage unit 310 to store a digital value representing the locked state voltage of the phase-lock loop 130 when the phase-lock loop 130 is in the locked state and prevents the digital storage unit 310 from overwriting the digital value stored in the digital storage unit 310 when the phase-lock loop 130 is in the holdover state.

In embodiments in which the digital storage unit 310 includes the selector 400 and the register 410, the selector 400 passes the digital input signal 305 to the register 410 based on the holdover control signal 105. In turn, the register 410 stores the digital value represented by the digital input signal 305 based on the storage clock signal 415. The method 500 then proceeds to step 535.

In step 535, a determination is made whether to perform a holdover of the phase-lock loop. In various embodiments, the loop filter 170 in conjunction with the holdover circuit 110 determine whether to perform a holdover of the phase-lock loop 130 based on the holdover selection signal 115 and the holdover selection signal 120. In this process, the loop filter 170 determines whether to open the switch S1 based on the holdover selection signal 120 and the holdover circuit 110 determines whether to close the switch on the holdover selection signal 115. If the low pass filter 170 determines to open the switch S1 and the holdover circuit 110 determines to close the switch S2, the method 500 proceeds to step 540. Otherwise, the method 500 returns to step 520. In other embodiments, the method returns to step 535 instead of the step 520.

In step 540, arrived at from the determination in step 535 to perform a holdover of the phase-lock loop, an analog voltage signal having the loop filter voltage indicated by the digital value is generated. In various embodiments, the holdover circuit 110 generates the analog voltage signal 325 based on the digital value stored in the holdover circuit 110. For example, the digital storage unit 310 of the holdover circuit 110 may generate the digital output signal 315 representing the digital value stored in the digital storage unit 310, and the digital-to-analog converter 320 of the holdover circuit 110 may generate the analog voltage signal 325 based on the digital value represented by the digital output signal 315.

Also in step 540, the holdover circuit 310 holds the digital value stored in the digital storage unit 310. In this way, the holdover circuit 310 maintains the digital value stored in the digital storage unit 310 in the holdover state. In embodiments in which the digital storage unit 310 includes the selector 400 and the register 410, the selector 400 passes the digital output signal 305 to the register 410 based on the holdover control signal 105. In turn, the register 410 stores the digital value represented by the digital output signal 305 based on the storage clock signal 415. The method 500 then proceeds to step 545.

In step 545, the loop filter voltage is regenerated based on the analog voltage signal. In various embodiments, the loop filter 170 regenerates the loop filter voltage 125 based on the analog voltage signal 325 so that the loop filter voltage 125 in the loop filter 170 is the same as the loop filter voltage 125 indicated by the digital value stored in the holdover circuit 110. In these embodiments, the switch S1 isolates the charge pump signal 165 from the capacitor C1 based on the holdover selection signal 120, and the switch S2 passes the analog voltage signal 325 to the capacitor C1 based on the holdover selection signal 115. In turn, the loop filter 170 regenerates the loop filter voltage 125 based on the analog voltage signal 325 by maintaining the charge of the capacitor C1. In this process, a current in the analog voltage signal 325 flows through the capacitor C1 to maintain the loop voltage 125 at the locked state voltage of the phase-lock loop 130.

In various embodiments, the loop filter 170 regenerates the loop filter voltage 125 when the phase-lock loop 130 transitions into a holdover state and continues to regenerate the loop filter voltage 125 during the holdover state such that the loop filter voltage 125 does not decay during the holdover state or the transition to the holdover state. As a result, the frequency of the output clock signal 185 remains constant and does not drift during the holdover state or the transition to the holdover state. In further embodiments, the loop filter 170 maintains the loop filter voltage 125 when the phase-lock loop 130 transitions back to the locked state. As a result, the frequency of the output clock signal 185 remains constant and does not drift during the transition back to the locked state. The method 500 then ends.

In various embodiments, the method 500 may include more or fewer than the steps 505-545 illustrated in FIG. 5 and described above. In some embodiments, the steps 505-545 of the method 500 may be performed in a different order than the order illustrated in FIG. 5 and described above. In some embodiments, some of the steps 505-545 of the method 500 may be performed in parallel or substantially simultaneously. In various embodiments, one or more of the steps 505-545 may be performed more than once in the method 500.

Although the invention has been described with reference to particular embodiments thereof, it will be apparent to one of ordinary skill in the art that modifications to the described embodiment may be made without departing from the spirit of the invention. Accordingly, the scope of the invention will be defined by the attached claims not by the above detailed description.

What is claimed is:

1. A holdover circuit comprising:
   an analog-to-digital converter configured to generate a digital value indicating a loop filter voltage in a loop filter of a phase-lock loop, the analog-to-digital converter further configured to generate a digital input signal based on the loop filter voltage, the digital input signal representing the digital value;
   a digital storage unit coupled to the analog-to-digital converter and configured to store the digital value based on the digital input signal and to generate a digital output signal representing the digital value stored in the digital storage unit, the digital storage unit comprising:
   a selector configured to select either the digital input signal or the digital output signal as a selected digital signal; and
   a register coupled to the selector and configured to store the digital value represented by the selected digital signal; and
   a digital-to-analog converter coupled to the digital storage unit and configured to generate an analog voltage signal based on the digital output signal, the analog voltage signal having the loop filter voltage indicated by the digital value for regenerating the loop filter voltage in the loop filter.

2. The holdover circuit of claim 1, wherein the digital storage unit is further configured to update the digital value stored in the digital storage unit based on a holdover control signal.

3. The holdover circuit of claim 2, wherein the digital storage unit is further configured to update the digital value stored in the digital storage unit continually when the phase-lock loop is in a locked state and hold the digital value stored in the digital storage unit when the phase-lock loop is in a holdover state.

4. The holdover circuit of claim 3, wherein the holdover circuit is further configured to determine if the phase-lock loop is in the locked state or the holdover state based on a holdover selection signal.

5. The holdover circuit of claim 3, wherein the digital storage unit is further configured to update the digital value stored in the digital storage unit periodically based on a storage clock signal when the phase-lock loop is in the locked state.

6. The holdover circuit of claim 5, wherein the holdover circuit is further configured to determine if the phase-lock loop is in the locked state or the holdover state based on a holdover selection signal.

7. A clock circuit comprising:
a phase-lock loop comprising:
- a phase detector configured to generate a phase error signal indicating a phase difference between a reference clock signal and an output clock signal;
- a charge pump coupled to the phase detector and configured to generate a charge pump signal based on the phase error signal, the charge pump signal indicating the phase difference between the reference clock signal and the output clock signal;
- a loop filter coupled to the charge pump and configured to generate a loop filter voltage based on the charge pump signal and to generate a loop filtered signal based on the loop filter voltage; and
- a voltage-controlled oscillator coupled to the loop filter and the phase detector, the voltage-controlled oscillator configured to generate the output clock signal based on the loop filter signal; and a holdover circuit coupled to the phase-lock loop and configured to generate a digital value indicating the loop filter voltage, store the digital value, and generate an analog voltage signal having the loop filter voltage indicated by the digital value for regenerating the loop filter voltage in the loop filter, the holdover circuit comprising:
- an analog-to-digital converter configured to generate the digital value indicating the loop filter voltage, the analog-to-digital converter further configured to generate a digital input signal based on the loop filter voltage, the digital input signal representing the digital value;
- a digital storage unit coupled to the analog-to-digital converter and configured to store the digital value based on the digital input signal and to generate a digital output signal representing the digital value stored in the digital storage unit, the digital storage unit comprising:
  - a selector configured to select either the digital input signal or the digital output signal as a selected digital signal; and
  - a register coupled to the selector and configured to store the digital value represented by the selected digital signal; and
- a digital-to-analog converter coupled to the digital storage unit and configured to generate the analog voltage signal based on the digital output signal, the analog voltage signal having the loop filter voltage indicated by the digital value for regenerating the loop filter voltage in the loop filter.

8. The clock circuit of claim 7, wherein the digital storage unit is further configured to update the digital value stored in the digital storage unit based on a holdover control signal.

9. The clock circuit of claim 8, wherein the digital storage unit is further configured to update the digital value stored in the digital storage unit continually when the phase-lock loop is in a locked state and hold the digital value stored in the digital storage unit when the phase-lock loop is in a holdover state.

10. The clock circuit of claim 9, wherein the holdover circuit is further configured to determine if the phase-lock loop is in the locked state or the holdover state based on a holdover selection signal.

11. The clock circuit of claim 9, wherein the digital storage unit is further configured to update the digital value stored in the digital storage unit periodically based on a storage clock signal when the phase-lock loop is in the locked state.

12. The clock circuit of claim 11, wherein the holdover circuit is further configured to determine if the phase-lock loop is in the locked state or the holdover state based on a holdover selection signal.

13. The clock circuit of claim 7, further comprising a reference clock signal monitor coupled to the phase-lock loop and the holdover circuit, the reference clock signal monitor configured to monitor the reference clock signal for a quality characteristic and to cause the phase-lock loop to transition into a holdover state if the quality characteristic does not meet a specification of the reference clock signal.

14. The clock circuit of claim 13, wherein the quality characteristic of the reference clock signal is an availability of the reference clock signal.

15. The clock circuit of claim 13, wherein the quality characteristic of the reference clock signal is an accuracy of the reference clock signal.

16. The clock circuit of claim 13, wherein the quality characteristic of the reference clock signal is a frequency of the reference clock signal.

17. The clock circuit of claim 13, wherein the reference clock signal monitor is further configured to cause the phase-lock loop to transition into a holdover state if the quality characteristic does not meet a specification of the reference clock signal and the phase-lock loop is in a locked state but to refrain from causing the phase-lock loop to transition into the holdover state if the phase-lock loop is in an unlocked state.

18. A method of performing a holdover of a phase-lock loop, in accordance with one embodiment, comprises:
- generating a digital input signal representing a digital value indicating a loop filter voltage in a loop filter of a phase-lock loop;
- storing the digital value based on the digital input signal;
- generating a digital output signal representing the stored digital value;
- selecting either the digital input signal or the digital output signal as a selected digital signal;
- storing the digital value represented by the selected digital signal; and
- generating an analog voltage signal based on the digital output signal, the analog voltage signal having the loop filter voltage indicated by the digital value for regenerating the loop filter voltage.

19. The method of claim 18, further comprising generating the loop filter voltage when the phase-lock loop is in a locked state and regenerating the loop filter voltage when the phase-lock loop is in a holdover state.

20. The method of claim 18, further comprising updating the digital value continually when the phase-lock loop is in a locked state and holding the digital value when the phase-lock loop is in a holdover state.

* * * * *